(12) United States Patent
Davidsson et al.

(10) Patent No.: US 6,343,096 B1
(45) Date of Patent: Jan. 29, 2002

(54) CLOCK PULSE DEGRADATION DETECTOR

(75) Inventors: Stefan H. B. Davidsson, Skarholmen; L. O. Mikael Lindberg, Taby; Per Strid, Tumba, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/116,200

(22) Filed: Jul. 16, 1998

(51) Int. Cl.$^7$ ................................................ H04B 3/46
(52) U.S. Cl. ...................... 375/224; 375/371; 327/151
(58) Field of Search ................. 375/214, 213, 375/224, 371, 374, 354, 359; 327/3, 41, 10, 165, 12, 291, 20, 292, 141, 296, 142, 298, 144, 151, 160, 299, 162, 164; 714/731, 724, 738; 326/93, 96; 395/551, 555, 556; 324/522, 521, 512, 527, 772, 555

(56) References Cited

U.S. PATENT DOCUMENTS

| | | | |
|---|---|---|---|
| 5,159,615 A | | 10/1992 | Clark |
| 5,317,215 A | | 5/1994 | Kranzler |
| 5,594,763 A | * | 1/1997 | Nimishakavi ............... 375/376 |
| 5,621,758 A | * | 4/1997 | Suzuki et al. ............... 375/238 |
| 5,670,901 A | | 9/1997 | Yoshida |
| 5,923,628 A | * | 7/1999 | Nogawa ..................... 369/50 |
| 5,949,255 A | * | 9/1999 | Shyu ........................... 327/36 |
| 6,014,587 A | * | 1/2000 | Shaw et al. ................... 607/45 |
| 6,036,653 A | * | 3/2000 | Baba et al. ................. 600/500 |
| 6,044,282 A | * | 3/2000 | Hlasny ....................... 455/574 |
| 6,253,348 B1 | * | 6/2001 | Davidsson et al. ......... 714/797 |

FOREIGN PATENT DOCUMENTS

| DE | 19500168 C1 | 4/1996 |
|---|---|---|
| GB | 2309839 A | 8/1997 |

* cited by examiner

*Primary Examiner*—Chi Pham
*Assistant Examiner*—Emmanuel Bayard (57) ABSTRACT

A clock pulse degradation detector monitors the leading and trailing edges of the monitored clock pulse train, and determines the number of leading and trailing edges of the supervised clock pulse train occurring within a single reference pulse. An external oscillator provides an external signal to a reset generator that develops reference pulses having a period less than that of a full cycle of the supervised clock pulse train, but longer than either a single pulse or land of the monitored clock pulse train. Based upon the number of leading and trailing edges detected in the supervised pulse train, a determination is made as to whether the supervised clock train is regular or irregular. Preferably, a pair of two-bit shift registers are utilized to accumulate the number of leading and trailing edges of the supervised clock pulse train. Logic is utilized to determine whether the number of leading and trailing edges stored within these two-bit shift registers indicate a regular or irregular clock pulse train.

32 Claims, 4 Drawing Sheets

CLOCK PULSE DEGRADATION DETECTOR

TECHNICAL FIELD OF THE INVENTION

The present application is generally directed to a method and circuit for detecting faults in or degradation of a digital clock pulse signal used for synchronization in digital systems. More particularly, the present application is directed to a method and circuit for detecting faults or degradation in a clock pulse signal utilized in a digital communications network, particularly for synchronization of the network.

BACKGROUND OF THE INVENTION

Over the last twenty years, digital processing of information has become increasingly important. Digital telecommunication and data communication networks are utilized in virtually every aspect of modern life. The use of digital clock pulse signals is common in all forms of digital information processing. Digital telecommunication or data communication networks are systems that often use clock signals, for network synchronization, which synchronization may be necessary to avoid loss of information transported between different nodes of the network or communication system.

Because of the importance of such clock pulse signals, such signals are often transmitted redundantly. Also, because of the importance of such clock pulse signals, it is desirable to supervise the generated clock pulse signal, setting an alarm if the clock pulse signal degrades or fails. Such an alarm can, in turn, be used to control other network functionality, for example, to switch in a standby clock pulse signal generator or to remove the faulty clock pulse signal using majority vote logic.

The supervision or monitoring of clock pulse signals has been performed in the past by means of a detector generally known as a loss of signal ("LOS") detector. Such LOS detectors will monitor the amplitude of the pulses produced by the digital clock pulse signal and will generate an alarm when the magnitude of the clock pulses decay below a threshold. Such LOS detectors are often slow to react to a gradual decay of the digital clock pulse signal, and thus may not detect faults or degradation sufficiently quickly. Further, such loss of signal detectors are not capable of detecting spurious pulses in the digital clock pulse signal, which spurious pulses may be caused, for example, by the jiggling of a connection to a cable used to transmit the digital clock pulse signal.

Another known method of monitoring or supervising a digital clock pulse signal is to sample the supervised clock with a detector having a sampling rate substantially higher than that of the supervised clock. While this can be effective when the clock frequency of the digital clock pulse signal is relatively low, this is not practical when the frequency of the supervised clock is high. Additionally, this type of detector can confuse a bunst of noise pulses as a correct signal.

Another possible method of detecting or monitoring clock pulse degradation is to detect whether a logical low-to-high transition (leading edge) or high-to-low transition (trailing edge) is received within a predetermined measurement interval. However, such a method may not readily detect noise pulses within the digital clock pulse signal. Effectively, this known method of monitoring takes snapshots of the monitored digital clock pulse signal, sampling it at periodic times. Because the signal is only periodically sampled, this known method may miss glitches in the monitored clock pulse signal of less than a clock period and length period.

The known detectors generally work acceptably when the clock pulse signal is started or discontinued in a controlled way, for example when controlled by an electronic gate resistant to pulse bounce. However, there are a number of fault situations that are not detected by such prior art detectors. For example, a cable transmitting the digital clock pulse signal may be removed, or the power to the clock pulse generator may be switched off, thereby causing unexpected digital clock pulse signal behavior. For example, when a clock cable with an active clock pulse signal is disconnected while transmitting the digital clock pulse signal, noise may be produced within the digital clock pulse signal. This could happen, for example, if the operator pulls out the wrong cable or switches off the wrong clock pulse generator by mistake.

Clock pulse signals are often distributed over paired cables as differential signals including a clock signal and an inverted clock signal. At the receiving end, a receiver will often transform the differential signal into a uni-polar signal. When such a clock cable is removed, one of the differential signals is often disconnected before the other. Thus, while a clock pulse signal is still being received, it will be degraded over many clock pulses, until the connection of the second of the differential signal pair is disconnected. In such a case, the differential receiver will continue to produce the degraded clock signal over many clock pulses. Further, even once both input terminals to the differential receiver are disconnected, the differential receiver will produce noise over many clock pulses, as such a differential receiver typically has considerable gain.

In a different situation, when the power to the clock pulse generator is switched off, often inadvertently, the signal level of the digital clock pulse signal will decay slowly, as compared to the clock period. At a certain point, the line receiver will no longer be able to detect the signal and will start to produce noise. In such circumstances, ordinary LOS detectors are slow to detect the loss of signal. Thus, a faulty signal can be transferred over a considerable number of clock pulses and will influence network synchronization in a negative way, typically resulting in data loss and/or network crashes.

OBJECTS AND SUMMARY OF THE INVENTION

It is an object of the invention to more quickly detect degradation and defects in a monitored or supervised digital clock pulse signal.

It is a further object of the present invention to detect the presence of spurious pulses or dropouts in the supervised digital clock pulse signal within a short time from the occurrence of such degradation.

It is an object to accomplish the above objects of the present invention with a monitoring circuit which operates asynchronously, and thus independently from the supervised or monitored digital clock pulse signal.

These objects are accomplished by a method and circuit which detects irregularity in the digital clock pulse train with a circuit which is driven by a reference pulse train developing a reference pulse train with pulses producing a monitoring period sufficient to ensure that the detected number of edges of the monitored pulse train, when exhibiting a normal clock rate, is within a desired range. While in the preferred embodiment, the minimum number of edges would typically be one, the concepts of the present application could be used in a detector which has a monitoring period that assures that more than one edge, for example, two edges, are sensed within the monitoring period for a monitored clock pulse train with a normal clock rate. Also, while a maximum number in the desired range is normally two, one leading and one trailing edge, another number may be selected. The reference pulse train employed by the system of the present application desirably has lands interposed between adjacent reference pulses, and which are longer than the longest of a single pulse or land of the monitored clock pulse train. The system of the present application desirably uses a reference clock pulse train that is generated asynchronously from the supervised or monitored clock pulse train.

The system of the present application detects logical low-to-high or logical high-to-low transitions (also known as leading and trailing edges) of the monitored clock pulse train and determines whether the number of leading and trailing edges of the monitored clock pulse train falls within a desired range. If the number of detected leading or trailing edges of the monitored clock pulse train which occur within a single reference pulse falls within a desired range, the monitored digital clock pulse train is determined to be regular. Otherwise, the monitored clock train is determined irregular.

According to the teachings of the present application, a reference clock pulse train is for example, configured with a fifty-percent duty cycle. Other duty cycles may be used. However, it is important for the pulses of the monitored pulse train to have a duration sufficient to ensure that the detected number of edges of the monitored clock pulse train when producing transitions at a normal clock pulse rate, is within a desired range, in one preferred embodiment at least one, but no more than two, one leading edges and one trailing edge. In the preferred embodiment, this pulse duration is preferably less than that of a full cycle of the monitor clock pulse train, but longer than both the pulse and land of a full-cycle.

The circuit and method of the present invention generally determines, during each monitoring period, the monitored or supervised clock pulse train to be regular if at least a specified range of clock edges, in the preferred embodiment, at least one leading or trailing edge but no more than one leading edge or one trailing edge are detected. Otherwise, the signal is determined irregular and an alarm is given.

In one preferred embodiment, the circuit employed in the system of the present application utilizes a pair of two-bit shift registers to store a count of the number of leading and trailing edges detected during a monitoring period. Logic is then utilized to determine whether the number of detected leading and trailing edges is representative of a regular or irregular signal. Of course, a shift register circuit such as that utilized in the preferred embodiment of the present invention requires a reset period. While the reset period may be shortened, transitions occurring within the reset period cannot be detected by a single pair of two-bit shift registers. Accordingly, in one embodiment of the present invention, the system seeks to shorten the reset period. However, even with a shortened reset period, such an embodiment has a blind period during which edges may not be detected, a circumstance which may be unacceptable in certain applications.

In a second embodiment of the present invention, two pairs of two-bit shift registers are utilized, one to monitor the clock pulse signal during the reset period of the other. Even in such an arrangement, if the reset signal supplied to these two two-bit shift registers are simply a phase inversion of one another, detection of leading or trailing edges during the transition between monitoring by these two detectors may not readily be performed. This can be corrected by shortening the reset period, creating overlap between the beginning of a new monitoring period and the end of an old monitoring period. Thus, in accordance with another embodiment, potential problems in this transition period are avoided through reconfiguration of the reference pulse train.

Further scope of applicability of the present invention will become apparent from the detailed description given hereinafter. However, it should be understood that the detailed description and specific examples, while illustrating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention described hereinabove may be more readily understood with reference to the following detailed description of the drawings which makes reference to the drawings appended hereto as follows.

DETAILED DESCRIPTION OF PREFERRED EMBODIMENTS

The preferred embodiments of the present invention will now be described with reference to the drawings appended hereto as described above in the brief description of the drawings. In such drawings, like elements will be accorded like reference numerals.

Figure 1:
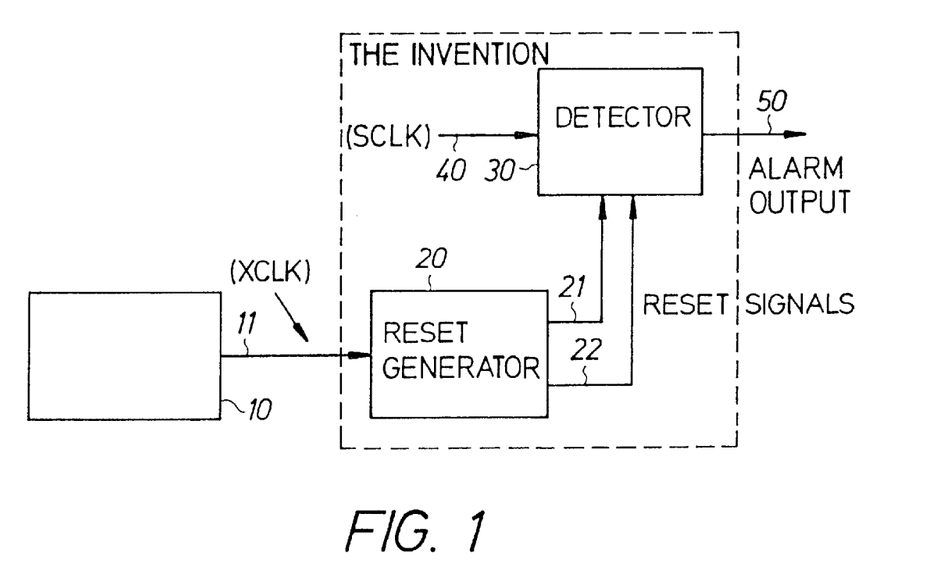
FIG. 1 is a block diagram of the system of the present application illustrating the relationship of a detector 30 produced in accordance with the system of the present application to a reset clock generator 20.

The clock pulse degradation detector of the present invention contemplates the use of paired two-bit shift registers asynchronously clocked by a reset pulse generator. FIG. 1 of the present application schematically illustrates an embodiment of the present invention. In such an embodiment, a supervised clock pulse signal SCLK provided on a supervised clock pulse input line 40 is supplied to a clock pulse degradation detector 30 constructed in accordance with the teachings of the present application. The clock pulse degradation detector 30 is also provided an external clock pulse signal XCLK on an external clock input line 11 from an external clock pulse generator 10.

The external clock pulse signal XCLK may be generated asynchronously from the supervised clock pulse signal SCLK and thus need not be derived therefrom. This provides advantages in that deterioration of the supervised clock pulse signal SCLK cannot adversely affect the performance of the clock pulse degradation detector 30 produced in accordance with the teachings of the present application. The external clock pulse signal XCLK is provided on the external clock input line 11 to the reset generator 20 and is used to generate a first and an optional second reference or reset signals RESET1, RESET2, provided on first and second reference or reset signal lines 21,22 for supply to the clock pulse degradation detector 30.

Figure 2:
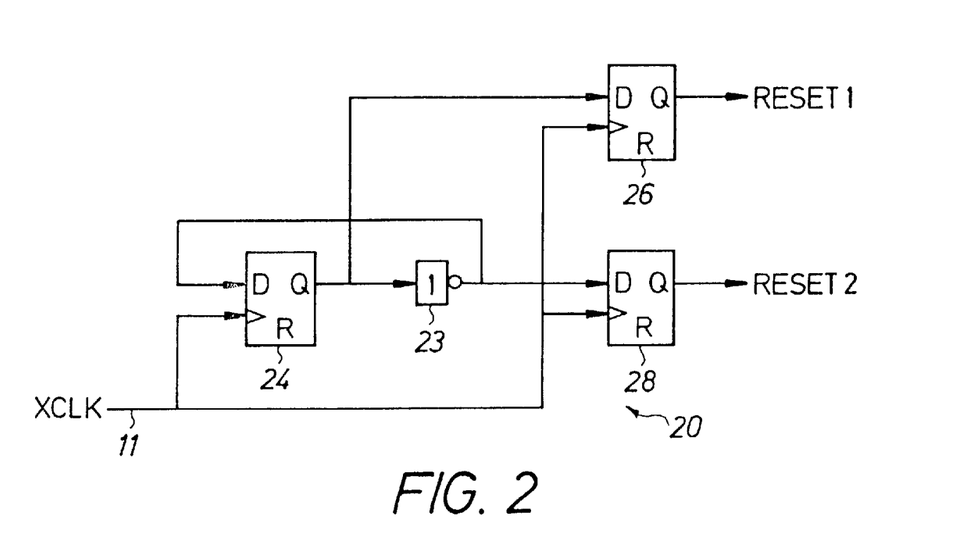
FIG. 2 illustrates one embodiment of the reset generator 20 of FIG. 1.

FIG. 2 illustrates one preferred embodiment of the reset generator 20 of FIG. 1. In FIG. 2, as in FIGS. 3, 6 and 7 of the present application, all flip-flops are preferably positive edge clocked D-type flip-flops with asynchronous reset as are well known in the art. In such clocked D-type flip-flops, the signal provided to the input D of the flip-flop is passed to the output Q upon receipt of a positive edge of a clock pulse at the clock input terminal C. Upon receipt of a high level reset signal at terminal R, the output Q of these flip-flops is set to a logical low or zero condition.

In FIG. 2, a frequency divider flip-flop 24 and a frequency divider inverter 23 operate in conjunction to provide an output Q of the frequency divider flip-flop 24 which has one-half the frequency of the external clock XCLK. Since the output Q of the frequency divider flip-flop 24 is inverted by the frequency divider inverter 23, the signal supplied to the input D of the frequency divider flip-flop 24 is always inverted with respect to the flip-flops output. Thus, upon each transition of the external clock XCLK from logical low to logical high, the output Q of the frequency divider flip-flop 24 is changed in state.

The non-inverted output Q of the frequency divider flip-flop 24 is supplied to a first reset synchronization flip-flop 26 while the output of the frequency divider inverter 23, inverting the output of the frequency divider flip-flop 24 is supplied to the second reset synchronization flip-flop 28. Upon each leading edge of the external clock XCLK, the reset signals RESET1, RESET2 change state. These signals are 180° out of phase with respect to each other, thereby producing the signals illustrated in FIG. 4 of the present application.

Figure 3:
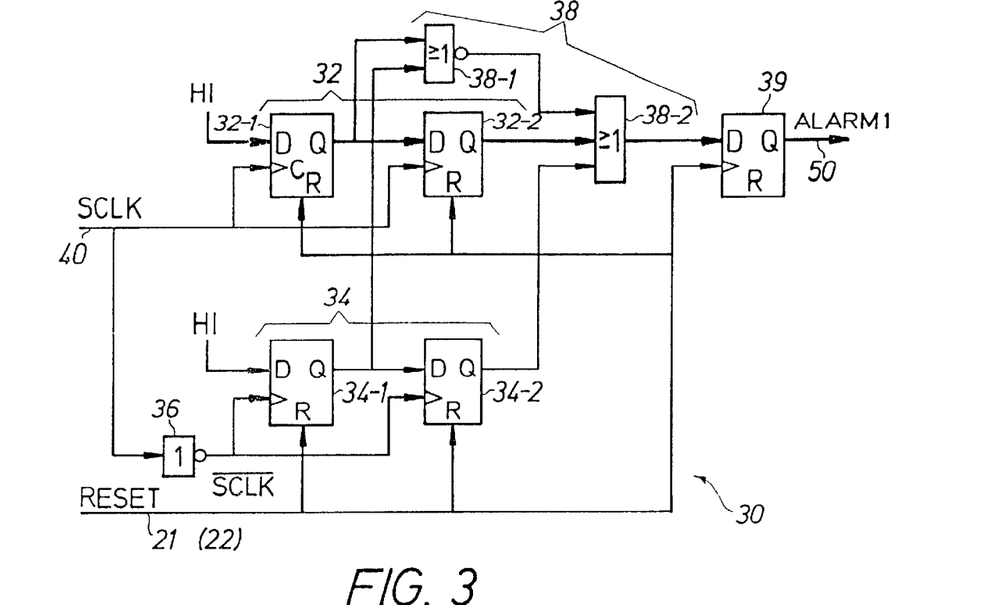
FIG. 3 illustrates one embodiment of the detector 30 of FIG. 1.

FIG. 3 illustrates one embodiment of the clock pulse degradation detector 30 of FIG. 1. As already explained, FIG. 3 employs first and second two-bit shift registers 32,34. The first two-bit shift register 32 includes first and second flip-flops 32-1, 32-2 while the second two-bit shift register 34 includes first and second flip-flops 34-1, 34-2. The signal input of the first flip-flops 32-1, 34-1 of the first and second two-bit shift registers 32,34 are connected to a logical high input source HI. The outputs Q of the first flip-flops 32-1, 34-1 of the first and second two-bit shift registers 32,34 are connected to the input D of the second flip-flops 32-2, 34-2 of the first and second two-bit shift registers 32,34.

Figure 4:
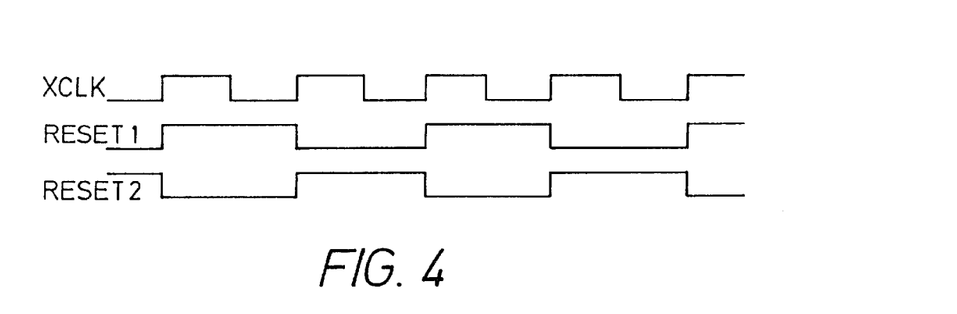
FIG. 4 illustrates the relationship of the RESET1 and RESET2 signals produced by the reset generator of FIG. 2 to the external clock XCLK in assordance with an embodiment of the present application.

The clock input of the first and second flip-flops 32-1, 32-2 of the first two-bit shift register are supplied the supervised clock signal 40 as an input thereof. A supervised clock signal inverter 36 is supplied to invert the supervised clock signal SCLK to produce SCLK which is the clock input supplied to the first and second flip-flops 34-1, 34-2 of the second two-bit reset 34. The reset signal RESET, which may correspond to RESET1 or RESET2 of FIG. 4, is supplied to the reset terminals of the respective flip-flops 34-1, 34-2.

The clock signal inputs of the respective flip-flops 32-1, 32-2 of the first two-bit shift register are responsive to a transition from a logical low to a logical high state. Therefore, the first two-bit shift register 32 counts the leading edges in the supervised clock train SCLK.

Due to inversion of SCLK by the supervised clock signal inverter 36 to form SCLK, the second two-bit shift register 34 is responsive to the trailing edges in the signal SCLK. It can accordingly be seen that the first and second two-bit shift registers accumulate information on the number of leading and trailing edges of the supervised clock SCLK during a monitoring period.

As has already been explained, the monitoring period according to the teachings of the present application is selected so that the detected number of edges of the monitored clock pulse train, when the pulse clock train is transmitting at a normal clock rate, will be within a desired range. In the preferred embodiment, the minimum number of clock pulse edges in the desired is one but no more than two, one leading edge and one trailing edge. This produces the fastest response to degradation of the clock pulse. However, the minimum number could be selected to be two or more within the teachings of the present application, and the maximum number within the range could be selected to be more than two. In the preferred embodiment, the monitoring period is selected to be shorter than a full cycle of the supervised clock SCLK and also at least slightly longer than the longest of a supervised clock pulse or the land. Desirably, the reset signal is selected to be slightly but not substantially longer than the longest of the clock pulse or land between adjacent clock pulses of the supervised clock SCLK. In the preferred embodiment, because of the selection of the monitoring period, a good clock signal will always produce at least a single leading edge or single trailing edge during the monitoring period.

According to the teachings of the present application as illustrated in FIG. 3, degradation or irregularity detection logic 38 is provided to ensure desired conditions are met. In the embodiment of FIG. 3, this degradation or irregularity detection logic 38 includes a leading and trailing edge detection NOR-gate 38-1 which receives the outputs of the first flip-flops 32-1, 34-1, of the first and second two-bit shift registers 32, 34. The output of the leading and trailing edge detection NOR-gate is logically low as long at least one of a leading and trailing edge is detected during the monitored period. Otherwise, the output of the leading and trailing edge detection NOR-gate 38-1 is logically high.

The degradation or irregularity detection logic 38 further includes a multiple or leading edge detection OR-gate 38-2. The output of the multiple leading or trailing edge detection OR-gate 38-2 is logically high if the output of either 1) the second flip-flop 32-2 of the first two-bit shift register 32 is logically high or 2) the second flip-flop 34-2 of the second two-bit shift register 34 is logically high thereby indicating the presence of more than one leading edge or more than one trailing edge, respectively.

For convenience, the output of the leading and trailing edge detection NOR-gate 38-1 is also supplied as an input to the multiple leading or trailing edge detection OR-gate 38-2. Thus, if there is a failure to detect a leading edge or a trailing edge, the output of the leading and trailing edge NOR-gate 38-1 will be logically high, and the multiple leading or trailing edge detection OR-gate 38-2 will produce a logically high output. If a logically high output is supplied by the multiple leading or trailing edge detection OR-gate 38-2, an alarm should be issued. An alarm synchronization flip-flop 39 clocked by the reference or reset pulse RESET causes the input D of the alarm synchronization flip-flop 39 to be supplied to its output Q, producing an alarm signal at the alarm output 50.

Figure 5:
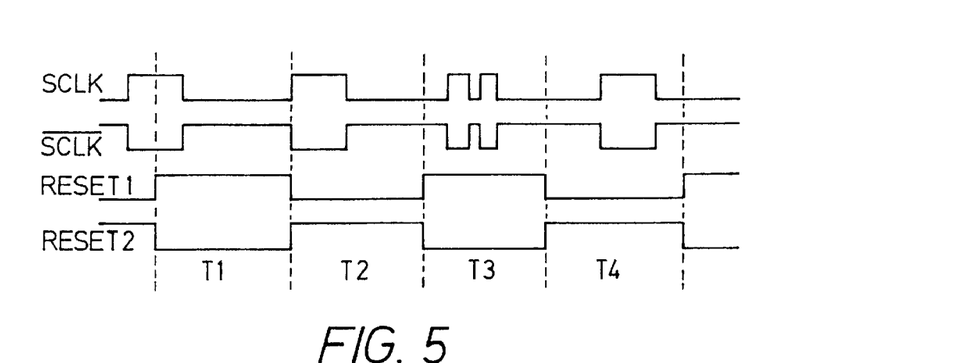
FIG. 5 illustrates the relationship of an exemplary supervised clock signal SCLK to the reset signals produced by the reset generator 20 of FIG. 2 in an embodiment of the present application.

The operation of the circuit of FIG. 3 can be better appreciated with reference to the timing diagram of FIG. 5. Assuming that the reset signal of FIG. 3 corresponds to RESET1 of FIG. 5, the first and second flip-flops of the first and second two-bit shift registers 32,34 are reset at the leading edge of RESET1. At the trailing edge of RESET1, a monitoring period initiated during which leading edges of the monitored clock will be counted by the first two-bit shift register 32 while trailing edges will be counted by the second two-bit shift register 34.

In FIG. 5, a trailing edge occurs during the monitoring interval T1 and a leading edge occurs immediately at the end of this monitoring interval reset interval. Thus, at least one leading or trailing edge is present but there are not two leading or trailing edges. This is similarly true in the time period T2. In time period T3, however, two leading edges and two trailing edges are detected. Thus, the outputs Q of the second flip-flops 32-2, 34-2 of both the first and second two-bit registers 32,34 go logically high and this logical high output is passed to the output of the multiple leading or trailing edge detection OR-gate 38-2 and thus an alarm, ALARM1 is issued.

Note that if neither a leading or trailing edge is detected, the output of the leading or trailing edge NOR-gate 38-1 produces a logical high signal, thereby generating an alarm if no edge is detected in the monitoring period.

The circuit of FIG. 3 is operable only after the reset signal goes locally high to reset monitoring and then logically low to begin the monitoring period. There are two possibilities for accomplishing reset. One possibility is to drive the reset signal logically high for the shortest possible time period. This results in the possibility that a glitch or additional pulse will occur during this logical high reset period, and no alarm will be issued in such a circumstance.

Figure 6:
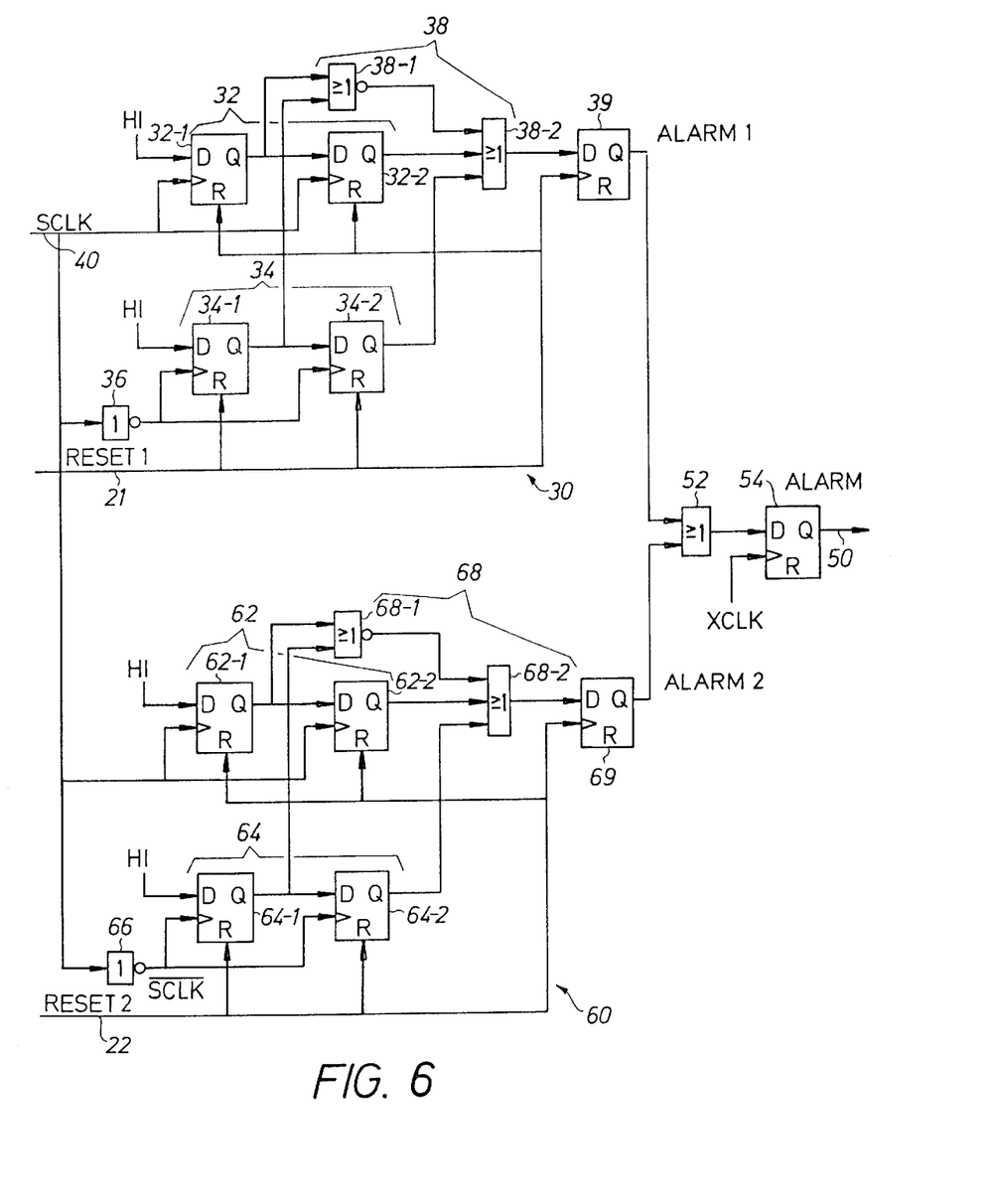
FIG. 6 illustrates an alternative embodiment of the detector 30 of FIG. 1 employing first and second clock cycle degradation detectors operated during different external clock pulse signal periods.
Figure 7:
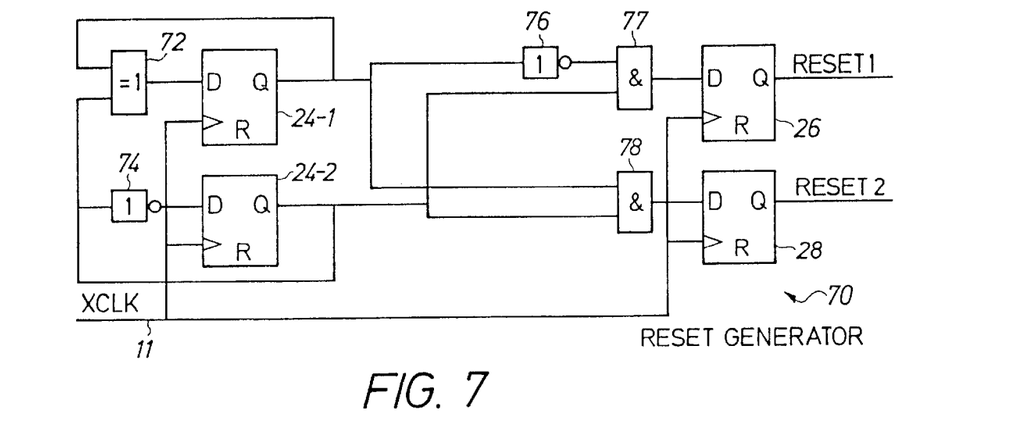
FIG. 7 illustrates an alternative embodiment of the reset generator 20 of FIG. 2 which provides for overlapping measurements periods, thereby avoiding the potential for missing supervised clock transitions occurring in the overlap period between the first and second reset pulses.

If this degradation in performance is acceptable, the circuit of FIG. 3 may be driven by an asymmetric reset generator of the type described in greater detail in FIG. 7 with a short reset period. However, if this degradation in performance is unacceptable, the system of the present application desirably mirrors the circuit of FIG. 3 and utilizes paired phase inverted reset pulses RESET1, RESET2 as illustrated in FIG. 5 and produced by the circuit of FIG. 2. This circuit is described in greater detail in FIG. 6.

In FIG. 6, the clock pulse degradation detector 30 of FIG. 3 is duplicated to form a first clock pulse degradation detector still numbered 30 and a second clock pulse degradation detector 60. Each of these detectors is substantially identical to that disclosed in FIG. 3 and thus will not be described in further detail. The sole difference between these detectors is that they are driven by phase inverted reset signals RESET1, RESET2. Thus, during the portion of the reset signal in which one of the clock pulse degradation detectors 30,60 is blind, the other is operational.

The outputs of the respective alarm synchronization flip-flops 39,69 are supplied to an alarm combining logic OR-gate 52 which produces a logically high output if an alarm signal is produced by either the first clock pulse degradation detector 30 or second clock pulse degradation detector 60. A master alarm synchronization flip-flop 54 is then clocked by the higher frequency external clock signal XCLK to produce an output alarm signal ALARM on the alarm output 50. Thus, the supervised clock signal SCLK is substantially continuously monitored for an alarm condition.

Figure 8:
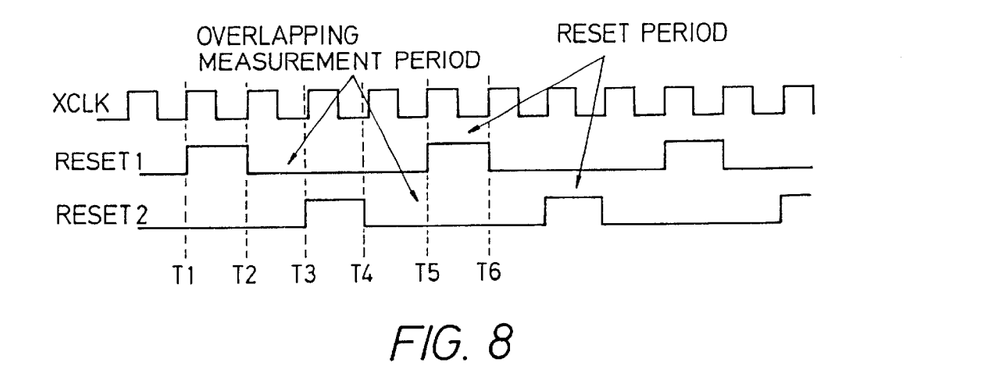
FIG. 8 illustrates the timing employed in the circuit of FIG. 7.

FIG. 7 illustrates one embodiment of a reset generator for generating overlapping measurement periods produced by reset signals RESET1 and RESET2. This embodiment produces reset signals RESET1 and RESET2 with overlapping measurement periods as illustrated in FIG. 8. In FIG. 7, the frequency divider flip-flop 24 and frequency divider inverter 23 of FIG. 2 are replaced by first and second frequency divider flip-flops 24-1,24-2, a frequency divider Exclusive-NOR(XNOR)-gate 72 and frequency divider inverter 74.

Upon receipt of a clock pulse XCLK from the external clock on the external clock input line 11, the first and second frequency divider flip-flops 24-1 and 24-2 are reset producing a logical low output. This logical low output is fed back into the input of the second frequency divider flip-flop 24-2 via a frequency divider inverter 74 to produce a logical high at the input D of the second frequency divider flip-flop 24-2. At the same time, this logical low signal is applied as an input to the frequency divider Exclusive NOR-gate 72. The frequency divider Exclusive NOR-gate 72 produces a logical high at its output when both inputs have the same logical state. Since the output Q of the first frequency divider flip-flop 24-1 is logically low, and the output from the second frequency divider flip-flop 24-2 is also logically low, the output of the frequency divider exclusive NOR-gate 72 is logically high. Thus, upon receipt of the next leading edge clock pulse XCLK, a logical high signal appears at the output Q of both the first and second frequency divider flip-flops 24-1, 24-2.

At the same time, since the outputs of both the first and second frequency divider flip-flops 24-1, 24-2 are initially logically low, the second AND-gate 78 produces a logically low signal which, when gated by the second reset synchronization flip-flop 28, upon receipt of the next leading edge of the external clock signal XCLK, is passed as an output of the reset signal RESET2, making RESET2 logically low. At the same time, the second inverter 76 inverts the logically low output of the first frequency divider flip-flop 24-1 and supplies as an input to the first AND-gate 77. Simultaneously, the logically low output of the second frequency divider flip-flop 24-2 is also supplied as an input to the second AND-gate 77. The second AND-gate 77 therefore supplies a logically low output to the first reset synchronization flip-flop 26, which upon receipt of a leading edge of the external clock signal XCLK, produces a logically low output RESET 1.

At the next leading edge clock pulse, the clock signals of the first and second frequency divider flip-flops 24-1 and 24-2 are actuated to clock the input state of these flip-flops to their respective outputs Q. Since flip-flop 24-1 has a logically high signal presented to its input D from the frequency divider exclusive NOR-gate 72, it is passed to the output Q as a logical 1. At the same time, the output of the frequency divider inverter 74 is logically high. Thus, on the next clock interval, the output Q of the second frequency divider flip-flop 24-2 is logically high. This produces a logical high signal at the output of the second AND-gate 78 and a logical low signal at the output of the first AND-gate 77. Thus, RESET 2 goes logically high at time t3 of FIG. 8.

Since the outputs of both the first and second frequency divider flip-flops 24-1 and 24-2 are logically high, the output of the frequency divider exclusive NOR-gate 72 is logically high, while the output of the frequency divider inverter 74 is logically low. Upon receipt of the next clock signal XCLK, the output of the first frequency divider flip-flop 24-1 goes logically high while the output of the second frequency divider flip-flop 24-2 goes logically low. The outputs of the first and second AND-gate 77 and 78 are therefore logically low and at the next clock cycle, the reset signals RESET1 and RESET2 are made logically low at time t4.

At the next clock cycle, the input to the second frequency divider flip-flop 24-2 goes logically high and the output of the first frequency divider flip-flop 24-1 becomes logically low. Thus, the output of the first AND-gate 77 goes logically high, and at the next clock cycle, at time t5, the RESET1 output becomes logically high. It is therefore apparent that the circuit of FIG. 7 produces the waveforms of FIG. 8.

If a single reset signal RESET1 is utilized, this reduces the period in which reset occurs, and the detector is inoperable. On the other hand, according to another preferred embodiment, the overlapping measurement periods are utilized to prevent loss of leading or trailing edges which may occur at the transition between the two reset signals of FIG. 4, and thereby prevent erroneous readings from the clock pulse degradation detector 30 of FIG. 6.

While the reset generator embodiment of FIG. 7 avoids the above-mentioned problems, it does have the disadvantage of requiring a higher clock frequency XCLK to achieve the same measurement period and result. Thus, in any particular application, the need for overlap must be balanced against clock performance to ensure that an optimized design is developed. Of course another reset signal generator which does not require a higher clock frequency XCLK could be used in such a circumstance within the contemplation of the present invention.

It should be understood that the spirit and scope of the present invention is described solely within the appended claims and that the preferred embodiments described hereinabove are for the purposes illustration only. It should be understood that modifications as would occur to one of ordinary skill in the art could easily be made in accordance with the teachings of the present application.

What is claimed is:

1. A method of monitoring a clock pulse train having a normal clock rate to detect irregularities therein comprising the steps of:
    a) developing a reference pulse train with pulses producing a monitoring period assuring that a detected number of edges of the monitored clock pulse train, when exhibiting a normal clock rate, is within a desired range;
    b) detecting leading and trailing edges of said monitored clock pulse train;
    c) determining whether the number of leading and trailing edges of said monitored pulse train occurring within a single monitoring period falls within the desired range; and
    d) based on the determination in step c), determining whether the monitored clock train is regular or irregular.

2. The method of claim 1 wherein said step b) of detecting includes an inverter to allow detection of trailing edges in said monitored clock pulse train.

3. The method of claim 1 wherein the smallest number in said desired range is one.

4. The method of claim 1 wherein the maximum number in said desired range is one leading edge and one traling edge.

5. The method of claim 1 wherein said monitoring period in said step a) is longer than either a single pulse or land of said monitored clock pulse train.

6. The method of claim 5 wherein said monitoring period is shorter than a full cycle of said monitored clock pulse train.

7. The method of claim 5 wherein the desired range used in said step c) of determining is at least one but no more than one leading edge and one trailing edge.

8. The method of claim 3 wherein said step d) determines that the monitored clock train is irregular if said number of leading and trailing edges is not at least one or if more than one leading or more than one trailing edge is detected.

9. The method of claim 5 wherein said reference clock pulses produced in said step a) of developing are slightly longer in duration than the longest of the single pulse or land of the monitored clock pulse train.

10. A detector monitoring a clock pulse train having a normal clock rate to detect irregularities therein comprising:
    a reference clock pulse generator developing pulses producing a monitoring period assuring that a detected number of edges of the monitored clock pulse train, when exhibiting a normal clock rate, is within a desired range;
    first and second counters counting the number of leading and trailing edges of said monitored pulse train during each monitoring period defined by said reference clock generator;
    a logic circuit determining whether the number of leading and trailing edges detected by said respective first and second counters falls within the desired range and determining whether the monitored clock train is regular or irregular based thereon.

11. The detector of claim 10 further comprising a conditioning circuit conditioning the reference clock pulses to facilitate detection of the leading and trailing edges of said monitored clock pulse train.

12. The detector of claim 11 wherein said conditioning circuit includes an inverter to allow detection of trailing edges in said monitored clock pulse train.

13. The detector of claim 10 wherein the length of said monitoring period is selected so that the smallest number in said desired range is one.

14. The detector of claim 10 wherein the length of said monitoring period is selected so that the maximum number in said desired range is one leading edge and one trailing edge.

15. The detector of claim 10 wherein the length of said monitoring period is longer than either a single pulse or land of said monitored clock pulse train.

16. The detector of claim 15 wherein said monitoring period is shorter than a full cycle of said monitored clock pulse train.

17. The detector of claim 10 wherein the desired range used in said logic circuit is at least one but no more than two leading and trailing edges.

18. The detector of claim 11 wherein said reference clock pulses produced by said reference clock pulse generator are slightly longer in duration than the longest of the single pulse or land of the monitored clock pulse train.

19. A clock pulse degradation detector comprising:
    an input receiving a clock pulse train to be supervised to determine the presence of degradation;
    a reference clock pulse generator generating reference clock pulses having a period less than that of a full cycle of said supervised clock pulse train but longer than either a single pulse or land of said supervised clock pulse train;
    a first shift register, operatively connected to said reference clock pulse generator to be reset by said reference clock pulses, and counting leading edges in the supervised clock pulse train;
a second shift register, operatively connected to said reference clock pulse generator to be reset by said reference clock pulses, and counting trailing edges in the supervised clock pulse train; and
a logic circuit; operatively connected to said first and second shift registers, to determine whether an acceptable number of supervised clock pulse train leading and trailing edges have been developed when said first and second shift registers are reset, to thereby detect degradation in said supervised clock train.

20. The detector of claim 19 wherein said first and second shift registers are two bit shift registers clocked by the supervised clock pulse train.

21. The detector of claim 19 wherein said detector further includes a conditioning circuit conditioning the reference clock pulses to facilitate detection of the leading and trailing edges of said supervised clock pulse train.

22. The detector of claim 21 wherein said conditioning circuit includes an inverter to allow detection of trailing edges in said supervised clock pulse train.

23. The detector of claim 19 wherein said logic circuit detects degradation of the supervised clock pulse train unless at least one leading or trailing edge is detected.

24. The detector of claim 23 wherein said logic circuit detects degradation of the supervised clock pulse train if more than one of said leading edges or more than one of said trailing edges is detected.

25. The detector of claim 24 wherein said first and second shift registers each have first and second respective stages, the output of each said first stage being monitored by said logic circuit to detect receipt of at least one leading or trailing edge, the output of each said second stage being monitored by said logic circuit to detect receipt of more than one of said leading edges or more than one of said trailing edges.

26. The detector of claim 19 wherein said reference clock pulse generator produces first and second phase offset reset signals for supply to reset said first and second shift registers;
said first and second shift registers being operative during a measurement period during either said reference clock pulses or the lands provided between said reference clock pulses;
the direction of the reset signals being shortened to reduce the period during which said supervised clock pulse train may not be monitored.

27. A clock pulse degradation detector comprising:
an input receiving a clock pulse train to be supervised to determine the presence of degradation;
a reference clock pulse generator generating first and second reference clock pulse signals having monitoring pulses with a period less than that of a full cycle of said supervised clock pulse train but longer than either a single pulse or land of said supervised clock pulse train;
a first supervised clock cycle degradation detector responsive to the first reference clock pulse signal, including
a first shift register, operatively connected to said reference clock pulse generator to be reset by said first reference clock pulse signal, and counting leading edges in the supervised clock pulse train;
a second shift register, operatively connected to said reference clock pulse generator to be reset by said first reference clock pulse signal, and counting trailing edges in the supervised clock pulse train; and
a first logic circuit; operatively connected to said first and second shift registers, to determine whether an acceptable number of supervised clock pulse train leading and trailing edges have been developed when said first and second shift registers are reset; and
a second supervised clock cycle degradation detector responsive to the second reference clock pulse signal, including
a third shift register, operatively connected to said reference clock pulse generator to be reset by said second reference clock pulse signal, and counting leading edges in the supervised clock pulse train;
a fourth shift register, operatively connected to said reference clock pulse generator to be reset by said second reference clock pulse signal, and counting trailing edges in the supervised clock pulse train; and
a second logic circuit; operatively connected to said third and fourth shift registers, to determine whether an acceptable number of supervised clock pulse train leading and trailing edges have been developed when said third and fourth shift registers are reset; and
a third logic circuit combining the outputs of said first and second reference clock cycle degradation detectors thereby detecting degradation during all portions of said supervised clock train.

28. The detector of claim 27 wherein said first through third logic circuits detect degradation of the supervised clock pulse train unless at least one leading or trailing edge is detected by each of said first and second supervised clock cycle degradation detectors.

29. The detector of claim 28 wherein said first through third logic circuits detect degradation of the supervised clock pulse train if more than one of said leading edges or more than one of said trailing edges is detected by either of said first and second supervised clock cycle degradation detectors.

30. The detector of claim 29 wherein said first and second shift registers each have first and second respective stages, the output of each said first stage being monitored by said first logic circuit to detect receipt of at least one leading or trailing edge, the output of each said second stage being monitored by said first logic circuit to detect receipt of more than one of said leading edges or more than one of said trailing edges;
said third and fourth shift registers each having first and second respective stages, the output of each said first stage being monitored by said second logic circuit to detect receipt of at least one leading or trailing edge, the output of each said second stage being monitored by said fourth logic circuit to detect receipt of more than one of said leading edges or more than one of said trailing edges.

31. The detector of claim 27 wherein said reference clock pulse generator produces first and second phase offset reset signals for supply to reset said first and second shift registers;
said first and second shift registers being operative during a measurement period during either said reference clock pulses or the lands provided between said reference clock pulses.

32. The detector of claim 31 wherein said measurement period of each of said first and second supervised clock cycle degradation detectors is lengthened to greater than a 50% duty cycle to prevent masking of edges occurring at the point of switchover between said said first and second reference clock cycle degradation detectors.

* * * * *